United States Patent [19]

Braslau et al.

[11] 3,849,707

[45] Nov. 19, 1974

[54] PLANAR GAN ELECTROLUMINESCENT DEVICE

[75] Inventors: Norman Braslau, Katonah; John J. Cuomo, Bronx; Erik P. Harris, Yorktown Heights; Harold J. Hovel, Putnam Valley, all of N.Y.

[73] Assignee: International Business Machines Corporation, Armonk, N.Y.

[22] Filed: Mar. 7, 1973

[21] Appl. No.: 338,773

[52] U.S. Cl. .......... 357/17, 317/235 AP, 317/235 R

[51] Int. Cl. .......... K01l 15/00

[58] Field of Search .......... 317/235 N, 235 AP

[56] References Cited

UNITED STATES PATENTS

| | | | |
|---|---|---|---|
| 3,363,155 | 1/1968 | Newman | 317/235 |
| 3,492,548 | 1/1970 | Goodman | 317/235 |
| 3,564,260 | 2/1971 | Tanaka | 250/213 |
| 3,596,151 | 7/1971 | Eldridge | 317/235 R |
| 3,649,838 | 3/1972 | Phelan, Jr. | 250/211 J |
| 3,683,240 | 8/1972 | Pankove | 317/235 R |
| 3,740,622 | 6/1973 | Pankove | 317/235 R |

OTHER PUBLICATIONS

Chu, J. Electrochem Soc., Vol. 118, No. 7, July 1971.
Hovel, Appl. Phys. Lett., Vol. 20, No. 2, Jan. 15, 1972.

*Primary Examiner*—Martin H. Edlow
*Attorney, Agent, or Firm*—George Baron

[57] ABSTRACT

A GaN electroluminescent structure has been fabricated on a silicon substrate allowing for the construction of light-emitting diodes in the visible region on a planar surface carrying other silicon dependent devices.

8 Claims, 3 Drawing Figures

PLANAR GAN ELECTROLUMINESCENT DEVICE

BACKGROUND OF THE INVENTION

The use of vapor grown GaN on a substrate of sapphire to obtain a light-emitting diode has been discussed in the Feb. 1, 1973 issue of *Electronics*, pages 40–41. For purposes to be described hereinafter, when making luminescent devices using GaN, it is desirable that the latter be highly resistive. In the deposition of GaN by chemical vapor deposition techniques, the deposition is such that the GaN is *n*-type and highly conducting, and zinc must be added to the deposited GaN to make it insulating to obtain light emission. In the present case, where GaN is deposited by rf sputtering onto silicon substrates, the GaN is highly resistive, a feature of the sputtering method for obtaining GaN films.

In addition, light-emitting devices made from vapor deposited GaN on sapphire substrates tend to emit their light in small spots, known as filaments, whereas devices constructed in the manner outlined in this invention emit their light uniformly over any desired area. The use of a silicon substrate also allows many of the highly developed features of silicon technology to be utilized. Consequently, light-emitting devices made from GaN on sapphire are not as desirable as those made from GaN on silicon as discussed herein.

RELATED COPENDING APPLICATIONS

An invention entitled "The Preparation of InN Thin Films" by J. J. Cuomo and H. J. Hovel, Ser. No. 184,405, filed Sept. 28, 1971 and assigned to the same assignee as applicant's assignee, treats of a method of depositing GaN on silicon, but in such copending and commonly assigned application there was no appreciation of how the method of depositing GaN on silicon could create a useful luminescent device.

SUMMARY OF THE INVENTION

Although the growth of GaN on a silicon substrate has been reported, see article by T. L. Chu in the 1971 issue of the *J. Electrochemical Society*, Vol. 118, page 1200, there was no recognition that thin films of GaN on silicon can be made electroluminescent. This recognition by applicants has led to the construction and use of thin films of GaN on silicon for optical devices, including displays and testing. The use of GaN is particularly attractive because the emitted light is in the blue portion of the visible region and such blue emission is difficult to attain with known light-emitting diodes. Its deposition on silicon permits one to employ the highly developed features of silicon processing technology. For example, light-emitting elements can be laid down coplanarly with other electrical devices and electrical circuitry on a single chip. Moreover, since the emitted light coming from the GaN is not filamentary in nature, but emanates instead uniformly from the entire upper surface of the GaN light-emitting device, conventional masking techniques may be employed to determine the size and shape of the emitting area, facilitating display design and manufacture.

The foregoing and other objects, features and advantages of the invention will be apparent from the following more particular description of the preferred embodiments of the invention as illustrated in the accompanying drawings.

DETAILED DESCRIPTION OF THE INVENTION

Figure 1:
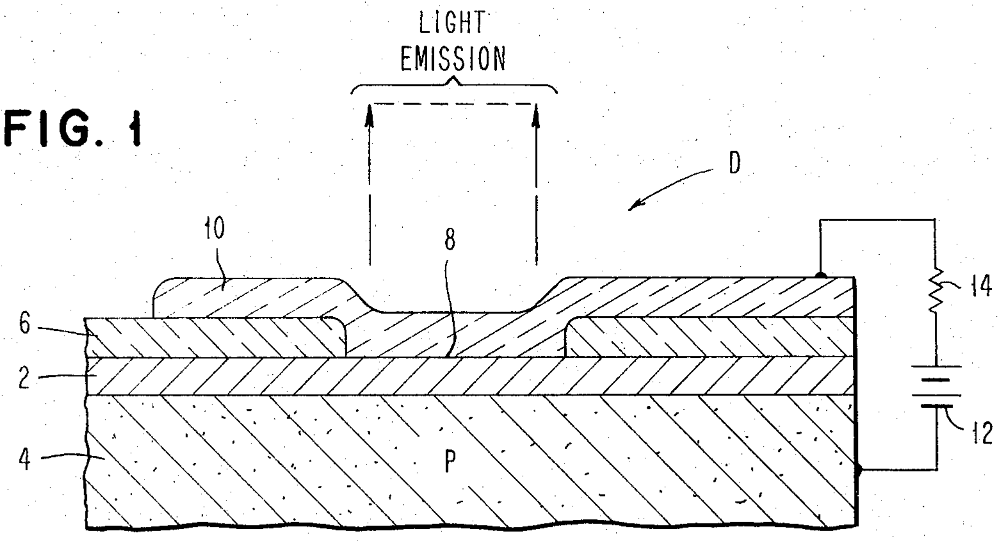
FIG. 1 is a cross-section of a preferred embodiment of the invention.

As seen in FIG. 1, a GaN layer 2 is reactively sputtered onto a *p*-type silicon substrate 4. A full description of the manner in which such layer 2 is sputtered onto substrate 4 is given in the publication entitled "Electrical and Optical Properties of *rf*-Sputtered GaN and InN" by H. J. Hovel et al. that appeared in the *Applied Physics Letters*, Vol. 20, No. 2, Jan. 15, 1972. Such GaN layer 2 is about 500–3,000A thick and is grown on silicon by using reactive *rf* sputtering. As is set forth in such above-noted Applied Physics Letters publication, a target was formed by nickel and molybdenum coated copper discs covered with layers of very pure Ga and mounted into a water-cooled cathode assembly. High purity nitrogen was further purified by passage through a titanium sublimation pump and was used both to sputter clean the substrate surfaces before growth and to form the GaN layer.

The chamber vacuum just before growth ranged from $(1–8) \times 10^{-8}$ Torr with the substrates at the growth temperature, after which the nitrogen was introduced to a final pressure of $2 \times 10^{-2}$ Torr to initiate the substrate cleaning process and finally the growth itself. The silicon substrate 4 was oriented in the (111) plane and the grown GaN layer was polycrystalline with highly preferred orientation. The GaN layers were grown at a temperature range of 25°–750°C. What was particularly desirable was the fact that such rf sputtered GaN layers 2 had high resistivities, i.e., $10^7\Omega$ cm and higher.

After the deposition of GaN layer 2 has been completed, a $SiO_2$ film 6, about 1,000–3,000A thick, is deposited over the GaN layer 2 and, by use of conventional masking and etching techniques, a window 8 of desired shape and size is etched into the $SiO_2$ layer. Finally, a tin doped layer 10 of indium oxide is reactively sputtered over the $SiO_2$ layer 6 and through window 8 onto the GaN layer 2, such indium oxide being of the order of 1,000–5000A in thickness. The indium oxide 10 serves as a transparent upper contact to the device and the silicon substrate 4 is the lower electrical contact. When a sufficient electrical voltage of either polarity is applied between upper and lower contacts 10 and 4, light is emitted uniformly from the GaN surface through window 8 and transparent indium oxide 10. Battery 12 and resistor 14 represent one possible circuit for applying the necessary voltage but any other suitable electrical driving means can be used to actuate light emission.

High electric fields, i.e., $\approx 10^6$ volts/cm, are needed to actuate the electroluminescent device and this is readily achievable if battery 12 is a 10 – 30 volt battery and layer 2 is of the order of 1,000–3,000A thick. The high resistivity of the GaN insures that very little current will flow even at this high electric field, so little power drain on the battery occurs; i.e., the light emission is actuated without requiring very much electrical power. The emitted light is pale blue and spectral measurements indicate that the peak wavelength of the emitted light is about 0.48$\mu$.

Although *rf*-sputtering of GaN on silicon is recommended because such process readily achieves a high resistivity GaN, the light-emitting device described herein can also be made using chemical vapor deposition techniques for the GaN, so long as such techniques achieve a high resistivity GaN layer. While it is not certain why uniform luminescence takes place from the GaN layer 2, one possible mechanism is that holes are injected uniformly from the silicon 4 into the GaN 2 and electrons are injected uniformly into the GaN layer 2 from the indium oxide film 10, allowing for hole-electron recombination and subsequent light emission uniformly throughout the GaN rather than in random spots of the material as in previous "filamentary" light emitting devices.

It should also be noted that other types of transparent contacts to the GaN can also produce the same light emitting properties as the tin doped indium oxide. Such films, for example, could be formed by indium oxide, tin oxide, copper oxide, semitransparent metals such as very thin Au or Al, and even a second layer of heavily doped GaN deposited on the first, high resistivity GaN layer.

It should also be noted that other semi-insulating (high resistivity) layers, such as AlN, can be substituted for the high resistivity GaN in the same basic structure and used to produce the same type of light-emitting device.

Figure 2:
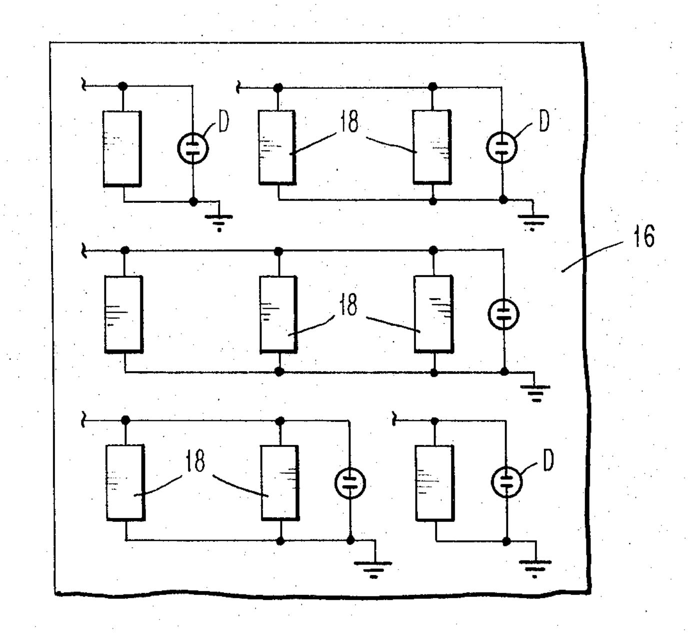
FIG. 2 is an example of the manner in which the invention can be used in a test device.
Figure 3:
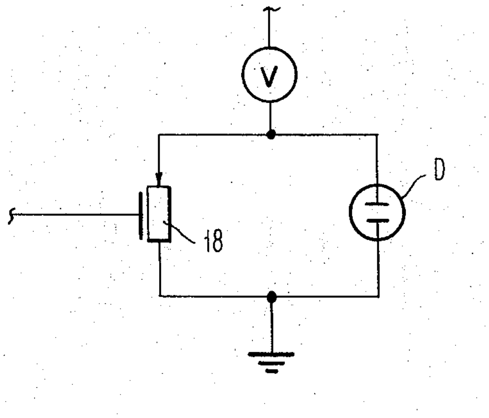
FIG. 3 is an enlarged view of a test station employing the test device of FIG. 2.

An additional asset of the device of FIG. 1 is its use for checking items on a silicon chip 16 shown in FIG. 2. Assume that the chip has many electrical units 18 that must operate at a given voltage for maximum efficiency. Throughout the top surface of chip 16, a GaN electroluminescent device D will be deposited, which device can be connected in parallel with any chosen unit. As seen in FIG. 3, assume that a circuit on a chip contains a series of field effect transistors (FET's) 18 to be tested. If the application of a voltage V to the FET's is of the proper value, then that voltage will cause the GaN device D of FIG. 1 to luminesce. If the voltage is not of the proper value, for example, due to leakage of current through the FET's, then there will not be sufficient voltage to actuate the electroluminescent device in parallel with it, and such failure to light up would be indicative of a failure in the circuit being tested. Because of the very high resistivity of the GaN, the test unit D that is compatible with silicon technology does not drain much test current, thus increasing the reliability of the test. Such use, per se, is not the invention of applicants.

A new electroluminescent device, namely, high resistivity GaN on silicon has been discovered that has a uniform output in the visible region of the electromagnetic spectrum, lends itself to being made readily in all shapes and sizes and its mode of manufacture is compatible with silicon planar technology.

What is claimed is:

1. An electroluminescent device comprising:
- a substrate of *p*-type silicon;
- a layer of high resistivity semi-insulating material on said substrate, said resistivity being of the order of $10^7$ ohm-cm or higher,
- a transparent electrical contact on said high resistivity semi-insulating material; and
- a high electrical potential connected between said substrate and said high resistivity semi-insulating material.

2. The device of claim 1 wherein said high resistivity material is GaN.

3. The electroluminescent device of claim 2 wherein said GaN varies between 500–3,000A in thickness.

4. The device of claim 1 wherein said transparent electrical contact is indium oxide.

5. The device of claim 4 wherein said indium oxide ranges in thickness from 1,000–5,000A.

6. The device of claim 4 wherein said indium oxide is tin-doped.

7. An electroluminescent device comprising:
- a substrate of *p*-type silicon;
- a layer of high resistivity GaN of the order of $10^7$ ohm-cm or higher on said substrate;
- a silicon dioxide layer on said GaN;
- a window in a selected portion of said silicon dioxide;
- a layer of indium oxide over said silicon dioxide including said window; and
- a high electrical potential connected between said substrate and said indium oxide.

8. The electroluminescent device of claim 7 wherein said silicon dioxide layer is 1,000–3,000A thick.

* * * * *